United States Patent [19]

Formeister

[11] 4,031,483

[45] June 21, 1977

[54] LIMITER CIRCUIT FOR SERVOSYSTEMS

[75] Inventor: Richard B. Formeister, Phoenix, Ariz.

[73] Assignee: Sperry Rand Corporation, New York, N.Y.

[22] Filed: Jan. 15, 1976

[21] Appl. No.: 649,307

[52] U.S. Cl. .............................. 331/17; 307/229; 318/563; 318/608; 328/167; 329/122; 331/23; 331/25; 333/70 R
[51] Int. Cl.² .................. G05B 11/06; G05B 23/02; H03B 3/04
[58] Field of Search .................. 331/17, 23, 18, 25; 329/122, 124, 125; 318/563, 565, 608, 683; 333/70 R; 328/167; 307/229

[56] References Cited

UNITED STATES PATENTS

| | | | |
|---|---|---|---|
| 3,903,482 | 9/1975 | Pausini et al. | 331/17 |
| 3,944,940 | 3/1976 | Desai | 329/122 |

Primary Examiner—Siegfried H. Grimm
Attorney, Agent, or Firm—Howard P. Terry; Seymour Levine

[57] ABSTRACT

A limiter circuit is installed in a servomechanism that establishes a signal at the output terminal of a filter contained therein, in the absence of an input signal within the lock range of the servomechanism, in a manner that maintains the charge on the filter consistent with the established output signal, thus providing favorable initial conditions for rapid reacquisition and smooth reacquisition transients.

11 Claims, 2 Drawing Figures

LIMITER CIRCUIT FOR SERVOSYSTEMS

BACKGROUND OF THE INVENTION

1. Field of the Invention

This invention relates generally to the art of servomechanisms and more particularly to a new and improved circuit to minimize the acquisition transients of such devices.

2. Description of the Prior Art

Applications exist in phase locked loops and in other servosystems for amplifiers which provide a control voltage, in the absence of an input signal, that is at a level near the control amplifier lock-up voltage to maintain the acquisition time within a desired interval. This type of operation is generally desired when a servo is faced with a situation wherein lock is broken frequently and a fast reacquisition time is a requirement. A communication system employing phase shift keying (PSK) modulation, wherein information is carried as phase discontinuities of a carrier signal, is an example of such a system. PSK communication systems employ phase locked loops to extract the carrier from the discontinuously phase modulated signal, and it is necessary to limit the reacquisition transients of the phase lock loop in order to minimize the probability of information error. Prior art methods of performing the necessary limiting have employed Zener diodes and adjustable voltage clamps which discharge the capacitors in the loop filter in the process of maintaining a minimum control voltage after lock has been lost. For the system to reacquire smoothly and track, starting at the minimum voltage maintained, the filter capacitors must maintain the charges that would have been present at that voltage had track not been lost. When this charge is not maintained, erratic initial tracking and acquisition results until the proper charge has been re-established. This invention provides a means by which the desired filter charge is maintained at the established voltage bound until the input signal again comes within acquisition range.

SUMMARY OF THE INVENTION

The subject invention provides a means for minimizing the acquisition transient time of a servomechanism by providing a limiter circuit that is coupled to the control amplifier contained within an active filter of the servomechanism that prevents the output voltage of the control amplifier from dropping below a predetermined voltage level whenever the servomechanism loses lock. A preferred limiter circuit according to the principles of this invention includes an operational amplifier and a diode. The non-inverting terminal of the operational amplifier is coupled to the output terminal of the active filter (which is the output terminal of the control amplifier) and the inverting terminal is coupled to an adjustable reference voltage source, which is adjusted to a level somewhat below the normal output voltage of control amplifier, while the cathode and anode of the diode couple to the output terminal of the operational amplifier and the input terminal of the control amplifier, respectively.

When lock-up occurs, the output voltage of the operational amplifier is more positive than the input voltage to the control amplifier and no current flows through the diode in the output circuit of the limiter. When the servosystem loses lock, the input voltage to the control amplifier is increased, causing its output voltage to decrease. This decrease continues until the reference voltage of the limiter amplifier is reached, at which time sufficient current flows through the conducting diode and in the output circuit of the limiter to maintain the input voltage to the control amplifier at a level that provides an output voltage which is equal to the reference voltage of the limiter amplifier. Additionally, the current flow through the diode maintains a charge on the active filter capacitors that is consistent with the control amplifier output voltage. In this fashion, an "inner" servo loop has been established which takes over from the "outer" loop when the desired parameters are achieved. This inner loop becomes a servomechanism to hold the control amplifier in a linear operating mode by forcing the control amplifier output to assume a voltage equal to the reference voltage, thus achieving a nearly ideal limiter.

A double valued limit action may be obtained by cascading two limiter circuits, each with an independent adjustable reference voltage source to bound the voltages of interest. Additionally, the invention may be utilized to observe all modes and transients of the settling process by simply varying the setting of the reference voltage to the limiter amplifier.

DESCRIPTION OF THE PREFERRED EMBODIMENT

Figure 1:
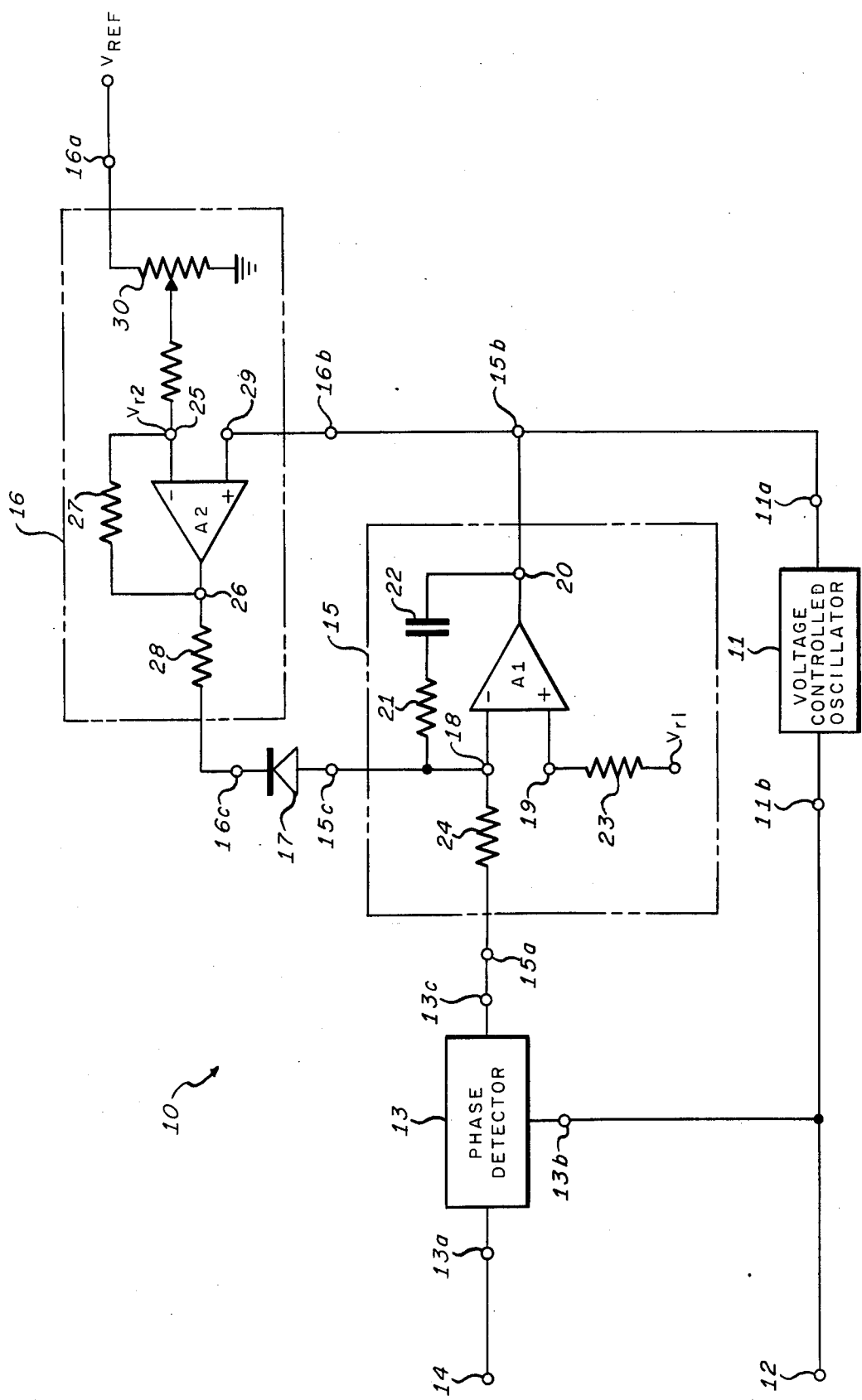
FIG. 1 is a schematic diagram, partially in block form, of a phase lock loop which incorporates the principles of this invention.

The operation of the invention is described with reference to a phase lock loop though it will be understood by those skilled in the art that the invention, as it pertains to the limiting of a signal at the output of a filter circuit is applicable to any servomechanism. Referring now to FIG. 1, wherein is shown a phase lock loop 10 which includes: a voltage controlled oscillator (VCO) 11 with an output terminal 11b coupled to the loop output terminal 12; a phase detector (PD) 13 having a first input terminal 13a coupled to the phase lock loop input terminal 14, and a second input terminal 13b coupled to the output terminal 11b of VCO 11; an active filter 15 having a first terminal 15a coupled to an output terminal 13c of PD 13, and a second terminal 15b coupled to an input terminal 11a of VCO 11; a limiter circuit 16 having a first terminal 16a coupled to an external source of voltage reference $V_{ref}$ (not shown), a second terminal 16b coupled to the second terminal 15b of the active filter 15; and a diode 17, the cathode of which couples to a third terminal 16c of limiter 16 and the anode of which couples to a third terminal 15c of the active filter 15. The active filter 15 includes: a control amplifier A1, which may be a differential operational amplifier, with the inverting terminal 18 being coupled to terminal 15a via a resistor 24, and the non-inverting terminal 19 being coupled via resistor 23 to a positive external voltage source (not shown) which provides a voltage $V_{r1}$; a resistor 21, one terminal of which is coupled to the inverting terminal of operations amplifier A1 and the other terminal of which couples to one terminal of a capacitor 22, the other terminal of which is coupled to the output terminal 20 of operational amplifier A1 which in turn is coupled to terminal 15b. While the limiter circuit 16 may include: a differential operational amplifier A2 with its inverting terminal 25 coupled to its output terminal 26 via resistor 27 and to terminal 16a via potentiometer 30 and with its non-inverting terminal 29 coupled to terminal 16b; and a resistor 28 coupled between the terminal 16c and the output terminal 26 of the operational amplifier A2. It is understood by those skilled in the art that the phase locked loop as described above is equivalent to a servosystem in which an integrator replaces the VCO and an adding means replaces the phase detector.

During normal operation, the voltage at terminal 13c of PD 13 servoes to reference voltage $V_{r1}$ and a voltage $V_c$ is coupled from terminal 15b of active filter 15 to the non-inverting terminal 29 of operational amplifier A2 and to the input terminal 11a of VCO 11 to maintain zero phase difference between the signals coupled to terminals 13a and 13b of PD 13. Also, a reference voltage $V_{r2}$ at the inverting terminal 25 of operational amplifier A2 is set to a level below the normal operating voltage $V_c$ by adjusting potentiometer 30. By the proper selection of values for resistors 27 and 28, a voltage at terminal 16c is established that is of greater potential than $V_{r1}$, the voltage at the inverting terminal 18 of operational amplifier A1, thus diode 17 is reverse-biased and no current flows through terminal 16c of the limiter 16.

When the input signal at the input terminal 13a of PD 13 is removed or is outside a well defined "lock" range, the voltage at output terminal 13c increases and the output voltage at terminal 15b of active filter 15 decreases until the reference voltage $V_{r2}$ is matched. At this time, the voltage at terminal 16c of the limiter 16 is less than $V_{r1}$ and diode 17 conducts causing current to flow from terminal 18 towards terminal 16c of the limiter 16 while current flows towards terminal 18 to terminal 13c of PD 13, thus preventing further discharge of capacitor 22 and preventing further decrease in the voltage at the output terminal 20 of operational amplifier A1. The voltage at output terminal 20 continues to servo at the level of $V_{r2}$ until a signal within the lock range of the phase lock loop is applied to terminal 14.

The reference voltage $V_{r2}$ allows VCO 11 to produce a signal frequency in the absence of a signal within lock range at input terminal 14 that is somewhat lower than the eventual signal frequency to be applied to input terminal 14. Since the frequency of the output signal from VCO 11 in the absence of a signal at the input terminal 14 is less than the frequency of the anticipated applied signal the voltage at terminal 13c of PD 13, at the time the anticipated signal is applied, becomes less than $V_{r1}$ and as a result current flows from terminal 18 towards terminal 13c of PD 13. This causes the charge on capacitor 22 and the voltage at terminal 15b to increase. These parameters of charge and voltage change at a faster rate than the output of the PD alone, because the limiter circuit now aids the total current flow at terminal 18 of the operational amplifier A1. When this voltage exceeds the reference voltage $V_{r2}$ diode 17 becomes reverse-biased and normal phase acquisition takes place. During the period that the voltage at terminal 15b is equal to $V_{r2}$ a charge is maintained on capacitor 22 that is consistent therewith. After the anticipated signal is applied to terminal 14, normal phase acquisition commences when the voltage at the output terminal 15b exceeds the reference voltage $V_{r2}$. At this time, acquisition begins with the charge on capacitor 22 commensurate with a voltage $V_{r2}$, thus a favorable initial condition exists and a smooth acquisition transient results.

The circuit operation described above provides rapid acquisition and smooth transient response due to the favorable initial conditions that exist in the loop filter at the time the input signal is applied to terminal 14.

Transient settling time for the acquisition phase is a function of the difference in voltage level between the voltage required at terminal 11a of VCO 11 to hold the loop in lock and the reference voltage $V_{r2}$ at terminal 25 of operational amplifier A2. The minimum value for this voltage difference is determined by the ability of the VCO to track the anticipated variations of the input signal with the limited control voltage range imposed by the limiter. This minimum value may be determined experimentally by varying the setting of the potentiometer 30. Additionally, the setting of the potentiometer 30 may be adjusted to establish a frequency for the VCO 11, in the absence of an input signal at input terminal 14, that is a given frequency separation from the anticipated input signal frequency, thus providing a means with which the transients of the settling process for the loop may be observed for various frequency separations between the anticipated signal frequency and the VCO 11 frequency in the absence thereof.

Figure 2:
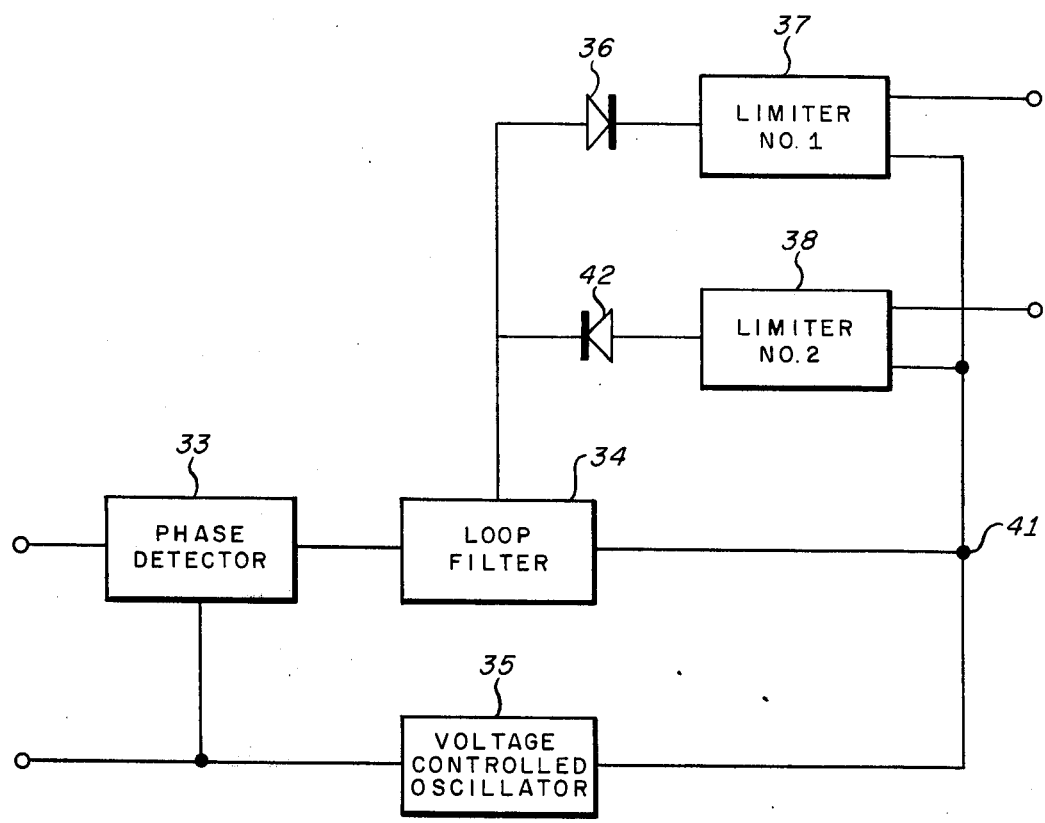
FIG. 2 is a block diagram of a phase lock loop which utilizes two limiters in cascade.

The system as described above provides a means for establishing a lower bound to the VCO control voltage of the phase lock loop. By paralleling two limiters as shown in FIG. 2, a double ended limit may be realized which provides an upper and lower bound to the VCO control voltage. In FIG. 2, PD 33, loop filter 34, VCO 35, diode 36, and the first limiter 37 operate as heretofore described. The second limiter 38 possesses the same circuitry as the limiter 16 of FIG. 1, however a greater reference voltage is applied thereto. After the voltage at node 41 has reached the level of the reference voltage of the first limiter 37, diode 36 becomes non-conducting as previously described. At this instance, the voltage to the positive terminal of the amplifier within the second limiter 38 is below the reference voltage applied to the negative terminal causing a negative voltage to be coupled to the diode 42. Since the output voltage from PD 33, which is coupled to the cathode of diode 42 is positive, diode 42 does not conduct. Thus, the control voltage at node 41 is allowed to linearly increase beyond the voltage level of the reference voltage of the first limiter 37 unitl it reaches the voltage level of the reference voltage of the second limiter 38, after which the anode of diode 42 becomes more positive than the cathode and the diode 42 becomes more positive than the cathode and the diode 42 conducts. The conduction is in a direction that causes the control voltage at node 41 to decrease, thus establishing an upper bound to the control voltage at node 41 that is equal to the level of the reference voltage applied to the second limiter 38.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. In a servomechanism of the type including a feedback loop having an error detecting means with first and second input terminals and an output terminal, for detecting and providing at said output terminal, an error signal consistent with a signal coupled to said first input terminal from an output terminal of said servomechanism and a signal coupled to said second input terminal; means, having an input terminal coupled to said output terminal of said error detecting means and an output terminal and containing means for storing electrical energy, for providing a filtered error signal at said output terminal; and means, coupled between said second input terminal of said error detecting means and said output terminal of said filter means for providing a signal representative of said filtered error signal, the combination with said filter means of means, coupled to said filter means, for limiting said error signal at said output terminal of said filter means to a predetermined signal level, in the absence of a signal at said input terminal to said servomechanism, that is within predetermined upper and lower bounds, said limiting to said predetermined signal level achieved in a manner that substantially maintains energy stored in said energy storage means, contained in said filter means, at a level that said storage means would have attained for a signal at said output terminal of said filter means equal to said predetermined signal level without said limiting.

2. In a servomechanism as in claim 1 the combination with said filter means further including a unidirectional current conductive means coupled between said limiter means and said filter means and poled to allow current between said limiter means and said filter means in a direction consistent with the maintenance of said predetermined signal level.

3. In a servomechanism as in claim 2 wherein said filter means comprises:
means for receiving a reference signal;
an amplifier having a first input terminal coupled to said unidirectional current conductive means, a second input terminal coupled to said reference signal receiver means and an output terminal coupled to said means for providing said signal representative of said filter error signal and to said limiter means;
a first resistor coupled between said error signal means and said first input terminal of said amplifier;
a second resistor having a first terminal coupled to said first input terminal of said amplifier and a second terminal; and
a capacitor coupled between said second terminal of said second resistor and said output terminal of said amplifier.

4. In a servomechanism as in claim 3 wherein said limiter means comprises:
means for receiving a second reference signal;
a second amplifier having a first input terminal coupled to said second reference signal receiver means, a second input terminal coupled to said output terminal of said amplifier of said filter means and an output terminal;
a third resistor coupled between said first input terminal and said output terminal of said second amplifier; and
a fourth resistor coupled between said output terminal of said second amplifier and said unidirectional current conductive means.

5. In a servomechanism as in claim 4 wherein said means for providing a signal representative of said filtered error signal is a voltage controlled oscillator and said error signal means is a phase detector, said voltage controlled oscillator coupled between said phase detector and said output terminal of said amplifier of said filter means thereby providing a phase lock loop wherein the signal coupled to a control terminal of said voltage controlled oscillator, in the absence of an input signal within a predetermined frequency range to said input terminal of said servomechanism, is limited to a said predetermined level thereby establishing, in the absence of said input signal, a predetermined oscillating frequency for said voltage controlled oscillator.

6. In a servomechanism as in claim 4 wherein said error detector means is a difference circuit in which the difference between said signals at said first and second input terminals of said error detector means is determined, thereby establishing said error signal, and said means for providing a signal representative of said signal at said output terminal of said filter means is an integrator circuit.

7. In a servomechanism as in claim 1 the combination with said filter means further including a second limiter means coupled to said filter means for limiting said signal at said output terminal of said filter means to a second predetermined level with the presence of an input signal at said first input terminal of said error detecting means whereby said upper and lower bounds are established for said error signal at said output terminal of said filter means.

8. In a servomechanism as in claim 7 further including a first unidirectional current conductive means coupled between said limiter means and said filter means and a second unidirectional current conductive means coupled between said second limiter means and said filter means, said first and second unidirectional current conductive means poled to allow current between said filter means and said limiter means and between said filter means and said second limiter means respectively in directions consistent with the maintenance of said first and second predetermined signal levels.

9. A method for observing the transient response of a servosystem containing a filter means which comprises:
coupling a limiter circuit containing a variable reference source to said filter means;
adjusting said reference source to establish a reference signal at said limiter circuit, said reference signal establishing a level to which the output signal of said filter means is servoed, in the absence of an input signal within a predetermined frequency range to said servosystem, such that energy storage devices contained within said filter means exhibit an energy storage that is consistent with said output signal of said filter means;
applying an input signal to said servosystem; and
observing the output signal of said servosystem from the time said input signal is applied to the time marking the completion of said transient.

10. A limiter, in combination with a filter means having an input and an output terminal and containing a storage element therein, comprising:
means for receiving a reference signal;
a differential operational amplifier having a first input terminal coupled to said reference signal receiver means, a second input terminal coupled to said output terminal of said filter means and an output terminal;
a first resistor coupled between said first input terminal and said output terminal of said differential operational amplifier; and a second resistor having a first terminal coupled to said output terminal of said operational amplifier and a second terminal;

a unidirectional current conductive device coupled between said second terminal of said second resistor and said filter means and poled to be operative when a signal at said input terminal of said filter means exceeds a specified value so that a signal at said output terminal of said operational amplifier servoes to a predetermined level thereby accomplishing said limiting in a manner that maintains a charge on said storage element at a value consistent with said predetermined signal level.

11. A limiter in accordance with claim 10 wherein said filter means is an active filter including an operational amplifier, a resistor coupled to an input terminal of said operational amplifier, a capacitor coupled between said resistor and an output terminal of said operational amplifier, said output terminal coupled to said second input terminal of said differential amplifier and said input terminal coupled to said unidirectional current conductive device.

* * * * *